(12) United States Patent
Wachter et al.

(10) Patent No.: US 6,289,576 B1
(45) Date of Patent: Sep. 18, 2001

(54) METHOD FOR DRAWING ELONGATED SUPERCONDUCTIVE WIRES

(75) Inventors: Peter Wachter, Zürich; Oscar Vogt, Pfeffikon; Rolf A. Gramm, Höstein, all of (CH)

(73) Assignee: VOCO Draht AG, Reinach (CH)

( * ) Notice: Subject to any disclaimer, the term of this patent is extended or adjusted under 35 U.S.C. 154(b) by 0 days.

(21) Appl. No.: 09/303,437

(22) Filed: May 3, 1999

Related U.S. Application Data

(63) Continuation of application No. 08/602,819, filed on Jun. 7, 1996, now abandoned.

(30) Foreign Application Priority Data

Jun. 30, 1994 (CH) .................................................. 02083/94
Jun. 23, 1995 (CH) .................................................. 01847/95
Jun. 27, 1995 (WO) .................................. PCT/CH95/00143

(51) Int. Cl.[7] .................................................. H01L 39/24
(52) U.S. Cl. ................................ 29/599; 505/1; 505/110; 505/433; 505/704; 505/739
(58) Field of Search ............................... 29/599; 505/110, 505/433, 430, 885, 1, 704, 939

(56) References Cited

U.S. PATENT DOCUMENTS

| | | | |
|---|---|---|---|
| 3,943,619 | * | 3/1976 | Hendrickson . |
| 4,952,554 | * | 8/1990 | Jin et al. . |
| 5,044,406 | * | 9/1991 | Yamazaki . |
| 5,081,075 | * | 1/1992 | Jin et al. . |
| 5,100,865 | * | 3/1992 | Yamamoto et al. . |
| 5,100,867 | * | 3/1992 | Gunzelmann et al. . |
| 5,252,550 | * | 10/1993 | Yamauchi et al. . |
| 5,462,920 | * | 10/1995 | Mukai et al. . |
| 5,987,731 | * | 11/1999 | Yamazaki . |

FOREIGN PATENT DOCUMENTS

| | | | |
|---|---|---|---|
| 3979943-A | * | 11/1990 | (EP) . |
| 0 456 927 | | 11/1991 | (EP) . |
| WO 89/06053 | | 6/1989 | (WO) . |

OTHER PUBLICATIONS

Hiroshi et al, Manufacture of Oxide Superconducting Tape-Shaped Wire Rod, Patent Abstracts of Japan, Pub. No. JP3263715 Pub. Nov. 25, 1991, vol. 16, No. 73.
Superconducting Wires of High Tc Oxides, Ohmatsu et al., Journal of Applied Physics, vol. 26 (1987) Supplement 26–3, 1987.

* cited by examiner

*Primary Examiner*—Carl J. Arbes
(74) *Attorney, Agent, or Firm*—Lowe Hauptman Gilman & Berner, LLP

(57) ABSTRACT

Superconducting, oxidic ceramic materials are worked to filamentary conductors, in that they are filled into silver tubes (2), drawn with the latter to filamentary conductors and then sintered under flowing oxygen. So that such filamentary conductors can be produced industrially with an adequate quality, drawing speed and yield, the silver tube (2) as a sintered sleeve is brought into contact with the ceramic material (1) in a drawing sleeve (3), of soft annealed steel (35) and the resulting sleeve combination undergoes the drawing stages. After drawing the steel drawing sleeve is removed by etching. In a large number of drawing stages, it is necessary to remove the drawing sleeve which has become hard due to the cold working and to replace it by a new, soft annealed sleeve. Simultaneously the sintering sleeve can undergo soft annealing.

16 Claims, 3 Drawing Sheets

METHOD FOR DRAWING ELONGATED SUPERCONDUCTIVE WIRES

This application is a Continuation of application Ser. No. 08/602,819 filed Jun. 7 1996 now abandoned.

FIELD OF THE INVENTION

The invention relates to a method for the manufacture of filamentary or wire-like superconductors, particularly for the manufacture of filamentary or wire-like superconductors with a small, circular or flat cross-section.

BACKGROUND OF THE INVENTION

Since the discovery of oxidic high temperature superconduction, materials have been known which have superconducting properties at temperatures up to 125° K. These materials are metallic oxide ceramics produced by sintering processes, i.e. very brittle and difficultly workable materials, which can only be brought into the forms necessary for technical applications with extreme difficulty. For many applications in the fields of electrical engineering and microelectronics, as well as for the manufacture of superconducting solenoid coils as energy stores there is a need for filamentary or strip-like conductors. These conductors are preferably to be manufacturable with diameters down to below 1 mm and with lengths up to several kilometers. Such conductors must be sufficiently flexible that they can be bent without suffering damage about a radius of approximately 20 mm. Particularly in connection with magnet construction, it is also important for the conductors to have a very high current density of above 10,000 A/cm$^2$ in the magnetic field.

Under Prof. Dr. P. Wachter a dissertation or thesis was produced at ETH Zurich (Diss. ETH No. 10213, Joachim L öhle), describing filamentary conductors for high temperature superconduction. It does not in fact relate to a superconducting material shaped in wire or filament fort, but an enveloped, sintered, oxidic, superconducting ceramic material, particularly $YBa_2Cu_3O_x$ or $Bi_2Sr_2CaCu_2O_x$. The filamentary superconductors are manufactured in that by multiple pressing, sintering and recomminution from the corresponding oxides, superconducting ceramic material is filled into a tube or sleeve and then the filled tube or sleeve is drawn in a per se known manner into a wire shape. So that the ceramic material has the desired superconducting properties in the completely drawn wire shape, it must again be sintered in this state (final sintering) under flowing oxygen.

Filamentary conductors with flat cross-sections (strips) are produced by rolling the not yet finally sintered, filamentary conductors and final sintering to the strip shape. The strips have higher current densities than the filamentary conductors with a circular cross-section, which is due to the compaction of the ceramic material and the crystallite orientation during rolling.

For drawing filamentary conductors, use is e.g. made of a metal tube with an external diameter of 10 mm and an internal diameter of 8 mm, into which is filled superconducting ceramic material and which is shaped by multiple drawing to a 0.5 mm external diameter and 0.4 mm internal diameter, a cross-sectional reduction of approximately 8% being obtained during each drawing stage.

According to an analogous method filamentary conductors and strips are produced with more than one superconducting core, in that the metal tube is filled with e.g. nine already drawn filamentary conductors in each case enveloping a core instead of being filled with the ceramic material. By filling a tube with already multicore, filamentary conductors the number of cores can be further increased.

In order that during the necessary final sintering the ceramic material can be brought into contact with the flowing oxygen, the sleeve material must have an adequate oxygen permeability. It is therefore proposed for the production of filamentary conductors to use e.g. silver tubes or palladium-alloyed silver tubes. Apart from an adequate permeability for oxygen, silver also has a sufficiently high melting point to allow a usable sintering temperature and is sufficiently chemically stable not to react during the sintering process with either the oxygen or the ceramic material. During the drawing of the filamentary conductors the silver sleeve is cold-worked and therefore becomes harder. Therefore during the aforementioned, exemplified drawing process between drawing stages, soft annealing must take place one or two times.

Highest demands must be made on the filamentary conductor quality, because defects can greatly influence superconduction. The filamentary conductors and, strips described in the aforementioned dissertation are produced by tiresome manual work, with costs which would be unacceptable for technical or industrial uses. The problems occurring for possible industrial manufacture and in particular with an acceptable drawing speed did not form the task of the aforementioned dissertation and are not referred to in any way therein.

SUMMARY OF THE INVENTION

An object of the invention is to provide a method with which it is possible to manufacture the above-described and similar filamentary superconductors on an industrial scale with a satisfactory precision, drawing speed and yield.

The difficulty encountered in the manufacture of the described, filamentary conductors and strips is due to the fact that silver is a relatively soft and ductile material, which offers a correspondingly low resistance to the drawing process. In addition, only part of the material to be drawn is silver (approximately 50% of the cross-section). The core is of a brittle, not ultrafine homogeneous material, which offers a completely different resistance to the working. As the sleeve material must in particular satisfy the requirements for the final sintering (oxygen permeability and chemical stability), it cannot be replaced in random manner by a material more optimum for the drawing process. Therefore irregularities disturbing or reducing the superconduction in filamentary conductors produced according to the prior art can only be avoided by exercising maximum care, which is unachievable in a technical method with acceptable drawing speeds. An optimization of the mechanical deformation or working by drawing and the material properties for the demanding final sintering cannot be achieved through one and the same material. Thus, the fundamental idea is to use two materials selected in optimum manner for the particular task, which together solve the described problem and enable the goal to be achieved.

In the method according to the invention the aforementioned difficulties are overcome in that the envelope filled with the superconducting material and which is to be worked or shaped is placed in a further envelope, so that there is a combination with an inner and an outer envelope, the inner envelope or sintering sleeve fulfilling in optimum manner the conditions for the final sintering and the outer envelope or drawing sleeve allowing a problem free drawing process, which is rapid compared with what has been hitherto achieved. The outer sleeve or envelope is so designed that during drawing it takes up most of the tensile force, in no way modifies or endangers the inner envelope and following drawing can be removed again from the wire shape produced.

An example of a procedure for the careful removal of the drawing sleeve from the sintering sleeve is an etching process.

Such a drawing sleeve can e.g. be a soft annealed steel tube (St 35), into which is introduced the sintering sleeve filled with the ceramic material in the form of a silver or silver alloy tube. The sleeve combination is subjected to a drawing process on a standard wire drawing machine and for each drawing stage there is once again a cross-sectional decrease of about 8%. Like the silver sintering sleeve)the outer drawing sleeve also becomes hard and brittle due to the cold working during drawing. Therefore the drawing process is interrupted at least once and the steel, now thin-walled drawing sleeve is etched away and the silver sintering sleeve is annealed at approximately 280° C. The sintering sleeve with the superconducting content is then introduced into a new, soft annealed drawing sleeve and then undergoes further drawing stages. The completely drawn product, in which the sintering sleeve enveloping the core has the desired diameter (cross-section), is again treated with acid to remove the drawing sleeve and is then subjected to a final sintering under flowing oxygen. The final sintering is performed in precisely the same way as with corresponding filamentary conductors, produced according to the known method of the aforementioned dissertation, i.e. the characteristics of the silver jacket are not influenced by the etching steps necessary for the removal of the outer steel jacket serving as a drawing aid.

As mentioned hereinbefore, it is possible to draw the sleeve combination on conventional wire drawing machines with corresponding drawing speeds. The filamentary conductor manufactured according to the method of the invention with a superconducting ceramic material core, fulfils the high quality demands made on superconducting, filamentary conductors. According to the method of the invention it is also possible to manufacture filamentary conductors with a flat cross-section (strips), in that the completely drawn sleeve combination is rolled flat, before the drawing sleeve is removed by etching, and the strip is finally sintered. It is also possible to manufacture filamentary conductors with a plurality of superconducting cores, in that silver sleeves are used as a basis, whose inner hollow cavity is not directly filled with the ceramic material and is instead filled with the finished, filamentary conductors with at least one superconducting core.

BRIEF DESCRIPTION OF THE DRAWINGS

The invention is described in greater detail hereinafter with reference to the drawings, wherein.

DESCRIPTION OF THE PREFERRED EMBODIMENTS

Figure 1:
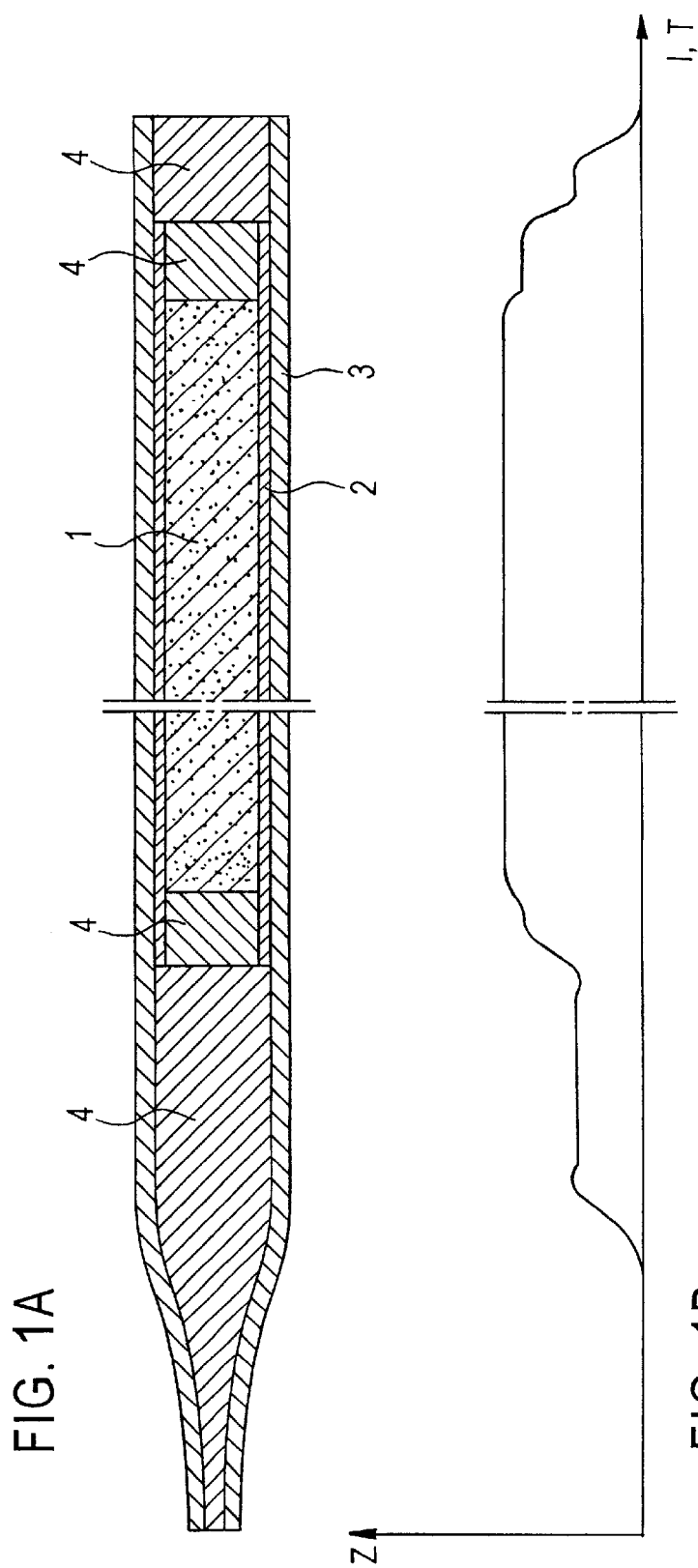
FIG. 1A is a longitudinal section through an wire or filament with superconducting core, sintering sleeve and drawing sleeve.
FIG 1B is a graph of tensile force during the drawing process.

FIG. 1A diagrammatically shows in section a sleeve combination, such as is used for drawing filamentary conductors with a core of superconducting ceramic material according to the method of the invention. Beneath the sleeve combination FIG. 1B shows a graph relative to the tensile force Z absorbed during drawing by the sleeve combination, the tensile force being shown as a function of the combination length i, i.e. the combination point passing through the drawing die, or the time T, particularly of the starting and finishing phase of the drawing process.

The sleeve combination comprises a core 1 of superconducting ceramic material, a silver or silver alloy sintering sleeve 2 and a soft annealed steel 35 (St 35) drawing sleeve 3. The ends of the tube combination are sealed with lead plugs 4.

In the first phase in which only the drawing sleeve 3 filled with the lead plugs 4 is drawn through the drawing die, the tensile force Z is relatively low and increases as soon as the silver sleeve enters the die. The tensile force reaches a maximum as soon as the ceramic material 3 is also drawn. It is noteworthy that this drawing process takes place very continuously, i.e. the tensile force remains in very stable manner at the maximum value for as long as the main part of the sleeve combination with core 1, sintering sleeve 2 and drawing sleeve 3 is drawn through the drawing die.

As an example, the method uses a sintering sleeve of a silver tube with an external diameter of 10 mm and an internal diameter of & am filled with superconducting ceramic material (e.g. $YBa_2Cu_3O_x$ or $Bi_2Sr_2CaCu_2O_x$) and is inserted in an outer tube (drawing sleeve) of soft annealed steel 35 with an external diameter of 16 mm and an internal diameter of 11 mm. The ends of this sleeve combination are sealed with lead plugs and drawn in several drawing stages with a cross-sectional reduction of in each case approximately 8% until a sleeve combination is obtained with a drawing sleeve having an external diameter of 6.6 mm and an internal diameter of 4.54 mm and a sintering sleeve with an external diameter of 4.54 mm and an internal diameter of 3.63 mm. The drawing sleeve is etched away and the sintering sleeve soft annealed. The annealed sintering sleeve is brought into a second drawing sleeve (once again of annealed steel 35) with an external diameter of 8 mm and an internal diameter of 5 mm and is further worked in further drawing stages until the drawing sleeve has an external diameter of 1.16 mm and an internal diameter of 0.725 mm, whereas the sintering sleeve has an external diameter of 0.25 mm and an internal diameter of 0.58 mm.

For the introduction of the sintering sleeve filled with the superconducting material into a drawing sleeve, particularly after already completed drawing stages, i.e. when the sintering sleeve already has a small cross-section and a significant length, use can be made of a continuous process in that the drawing sleeve in the form of an enveloping strip is placed around the sintering sleeve immediately prior to drawing. This allows roll-to-roll processes.

Figure 2:
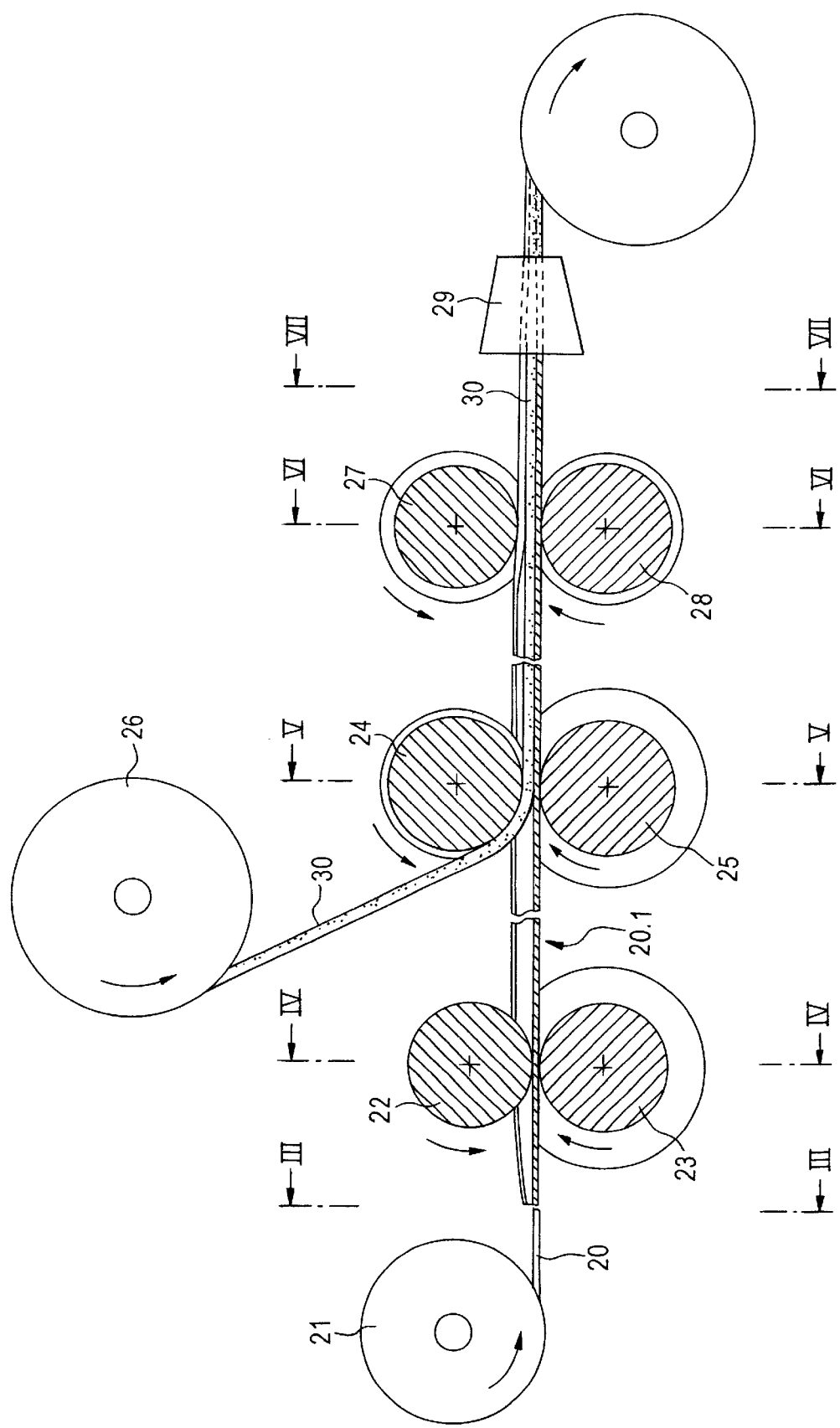
FIG. 2 a schematic side elevation of a drawing apparatus showing the sheathing process for introducing the wire into the drawing sleeve.
Figure 3:
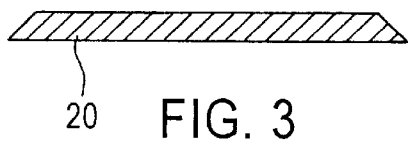
FIGS. 3 to 6 are transverse sectional views through the drawing sleeve and wire during the sheathing process along lines III-II, IV—IV, and VI—VI of FIG. 2.

FIG. 2 diagrammatically shows an example of a roll-to-roll process. FIGS. 3 to 7 are cross-sections particularly through the strip 20 to be shaped to the drawing sleeve and through the wire 30 with sintering sleeve and drawing sleeve in accordance with the section lines III—III, IV—IV, V—V, VI—VI and VII—VII in FIG. 2.

Figure 4:
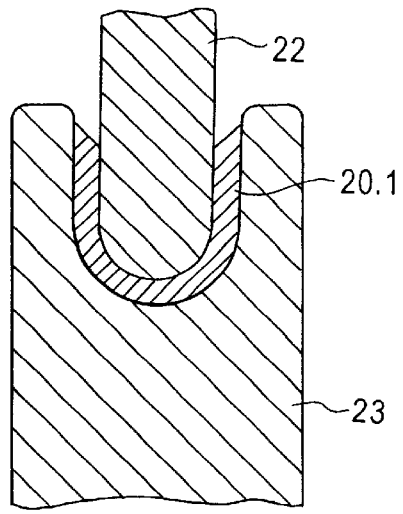

The enveloping strip 20 (cross-section along section line III—III in FIG. 3), which is e.g. of steel 35, is e.g. fed into the enveloping means from a storage roll 21. Between a first pair of rolls 22/23 the enveloping strip 20 is deformed to a U-shaped profile 20.1, whose internal diameter corresponds to the diameter of the wire 30 to be enveloped. FIG. 4 shows the profiles of the two rolls 22 and 23 and the U-shaped profile 20.1 in cross-section (section line IV—IV).

Figure 5:
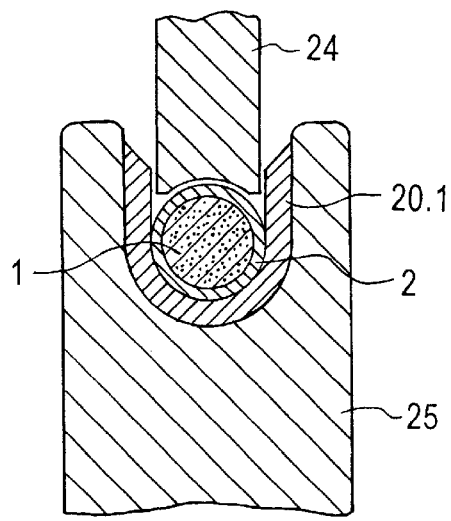

In the U-shaped profile 20.1, with the aid of a second pair of rolls 24/25, is inserted the wire 30 (comprising the superconducting core 1 and the sintering sleeve 2), to whose diameter is matched the internal diameter of the U-shaped profile 20.1. The wire 30 is supplied directly from a roll 26 or from an upstream, not shown drawing mechanism. FIG. 5 shows the profile of the rolls 24, 25, as well as the wire comprising the superconducting core 1 and sintering sleeve 2 placed in the U-shaped profile 20.1.

Figure 6:
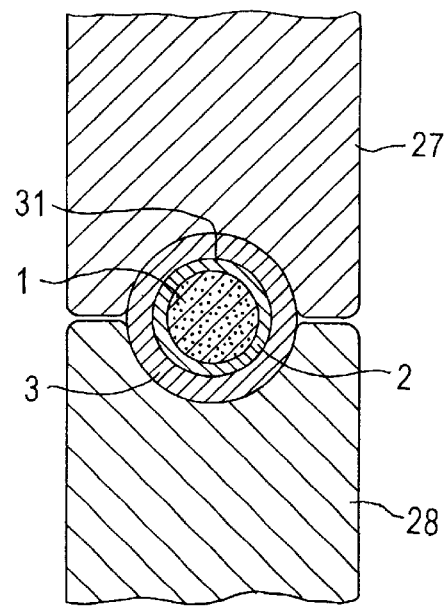
Figure 7:
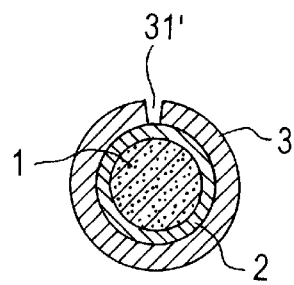
FIGS. 7 & 8 are transverse sectional views along line VII—VII of embodiments of double-enveloped wires with superconducting cores following a sheathing process according to FIGS. 2 to 6.

The U-shaped profile 20.1, with the aid of a third pair of rolls 27/28, is closed around the wire 30 and now forms the drawing sleeve 3. FIG. 6 shows the profile of the rolls 27, 28 and a cross-section through the double-enveloped wire (1/2/3). The drawing sleeve, produced in a continuous enveloping process, as opposed to a drawing sleeve produced from a tube has a seam or joint 31 which, as shown in FIG. 6, can be a radially oriented butt joint. If the double-enveloped wire, as shaped between the roll pair 27/28, is removed from the guide of said pair, the joint 31 can easily open again due to the elasticity of the material of the drawing sleeve 3 and as illustrated in cross-section through the same wire according to FIG. 7 (section line VII—VII in FIG. 2), so that a gap 31' is formed in the drawing sleeve.

The completely enveloped wire is then e.g. drawn directly through a drawing die 29 and then rolled up. During drawing the gap 31' is closed again by the radially acting forces.

Figure 8:
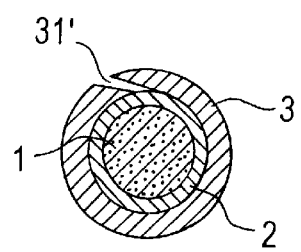

FIG. 8 shows a cross-section through a double-sheathed wire, which has an oblique and not radial seam or joint 31'. The same procedure can be used for producing differently shaped joints. In each case the narrow sides of the enveloping strip 20 must be constructed in accordance with the joint to be produced, the precision of the strip cross-section being selected in such a way that as a result of the joint or seam 29 produced in the enveloping process neither the drawing characteristics of the double-enveloped wire are negatively influenced, nor does the said seam or joint deform the sintering sleeve 2 or superconducting core 1, so as to cause any deterioration thereto.

In place of an enveloping process according to FIG. 2, which is based on an enveloping strip 30, use can be made of a method directly using a U-shaped profile 20.1, which is previously, advantageously soft annealed.

In place of two roll pairs 22/23 and 27/28 for deforming the enveloping strip 20 to the drawing sleeve 3, for a multistage deformation more than two roll pairs can be used.

The roll pairs 22/23, 24/25 and 27/28 can be driven and be used not only for the deformation of the enveloping strip and for positioning the wire in the partly deformed strip, but also for conveying the wire 30 and enveloping strip 20 with a minimum of tensile and impact forces through the enveloping process.

If for enveloping the wire, comprising a sintering sleeve and superconducting core with a drawing sleeve, use is made of a method according to FIGS. 2 to 7 or some similar method, this means that during the enveloping process the drawing sleeve is already cold worked and therefore, for drawing purposes, has in all probability a slightly reduced ductility compared with a soft annealed sleeve. This weans that in comparison with a method in which the drawing sleeve is constituted by an annealed tube, it will be necessary to etch away and replace the drawing sleeve after a few drawing stages, i.e. following a smaller cross-sectional reduction. For each specific case the drawing expert must decide on an optimum between drawing sleeve material, enveloping process, drawing sleeve thickness and cross-section reduction between two enveloping stages.

What is claimed is:

1. In the process of producing a wireform superconductive article of predefined length and diameter, which is a length of at least about 1 kilometer and a diameter of less than about 1 mm, by the process that comprises:

A. disposing a high temperature superconductive composition in a sleeve, comprising a metallic composition comprising silver, to form a filled sintering sleeve, wherein said sintering sleeve has an outside diameter substantially greater than about 1 mm and wherein said metallic composition is permeable to oxygen and is sufficiently ductile to be drawable;

B. subjecting said filled sintering sleeve to a sufficient number of diameter reducing steps in a wire drawing process to form a drawn, filled sintering sleeve having said predefined length and diameter, wherein as a consequence of said wire drawing process said sintering sleeve is cold worked and therefore becomes less ductile and harder;

C. heat treating said drawn sintering sleeve in effective contact with of oxygen at a temperature and for a time sufficient to sinter said superconductive composition;

the improvement, whereby enabling the formation of substantially endless superconducting wire of said predefined length and diameter, that comprises;

D. at least substantially surrounding said sintering sleeve with a first drawing sleeve, comprising a metal of greater tensile strength and higher hardness than said sintering sleeve, to form a first composite structure comprising said superconductive composition as a core, said sintering sleeve about said core, and said drawing sleeve about said sintering sleeve;

wherein said drawing sleeve has the ability to take up a substantial proportion, that is a greater portion than said sintering sleeve, of the tensile forces exerted on the first composite structure during a subsequent diameter reducing wire drawing thereof;

E. subjecting said first composite structure to a sufficient number of diameter reducing steps in a wire drawing process to form a first drawn, substantially endless wire form product, wherein said drawn sintering sleeve has a diameter that is greater than said predefined wire form diameter, and wherein, as a consequence of said drawing, at least one of said sintering sleeve and/or said drawing sleeve will have become sufficiently hardened, embrittled and reduced in ductility, to substantially interfere with a continued wire drawing process;

F. removing said first drawing sleeve under conditions sufficient to not substantially adversely affect said sintering sleeve of said first substantially endless drawn wire form product;

G. annealing said first drawn sintering sleeve surrounding said superconducting composition, under conditions sufficient to increase the ductility of said sintering sleeve without substantially affecting said superconductive core material, to form a first annealed sintering sleeve;

H. at least substantially surrounding said first annealed sintering sleeve with a second drawing sleeve, comprising a metal of higher tensile strength and greater hardness than said first annealed sintering sleeve, to form a second composite structure;

I. subjecting said second composite structure to a sufficient number of diameter reducing steps in a second diameter reducing wire drawing process to form a second substantially endless wire form product, comprising a drawn sintering sleeve having said predetermined diameter;

J. removing said second drawing sleeve to form a second drawn sintering sleeve, wherein said removal of said second drawing sleeve is conducted under condition that will not substantially adversely affect said sintering sleeve and/or said superconductive core material; and K. heat treating said drawn sintering sleeve in effective contact with of oxygen at a temperature and for a time sufficient to sinter said superconductive core composition, to thereby form a substantially endless wire form product comprising a sintered superconductive core.

2. The improved process as claimed in claim 1 wherein the metals of both of said drawing sleeves are substantially the same.

3. The improved process as claimed in claim 1 wherein the metals of both of said drawing sleeves comprise, prior to drawing, soft, annealed steel.

4. The improved process as claimed in claim 1 wherein at least one of said drawing sleeves is removed by etching with acid.

5. The improved process as claimed in claim 1 wherein each of E and I, respectively comprises a plurality of drawingsteps.

6. The improved process as claimed in claim 5 wherein each drawing step reduces the diameter of said drawn composite material by about 8%.

7. The improved process as claimed in claim 1 wherein said superconductive core comprises at least one member of the groups consisting of $YBa_2Cu_3O_x$ and $Bi_2Sr_2CaCu_2O_x$.

8. The improved process as claimed in claim 1 further comprising forming said reduced diameter wire form product into a substantially flat form product.

9. The improved process as claimed in claim 1 wherein said core comprises a plurality of physically separate superconductor compositions each in a separately defined filamentary form.

10. The improved process claimed in claim 9 wherein the chemical composition of at least two of said separate superconductive compositions is substantially the same.

11. The improved process as claimed in claim 1 further including substantially continuously substantially surrounding said sintering sleeve with said drawing sleeve.

12. The improved process as claimed in claim 1 further including substantially surrounding at least one of said sintering sleeves with a corresponding drawing sleeve in such a manner as to leave a substantially longitudinal opening in said drawing sleeve.

13. The improved process as claimed in claim 1 wherein at least one of said drawing sleeves is disposed about a portion of its corresponding sintering sleeve as a "U" shaped cross section, and then bending the arms of said "U" toward said sintering sleeve to substantially surround said sintering sleeve while leaving a substantially longitudinal slit in said drawing sleeve.

14. The improved process as claimed in claim 1 wherein, when said two successive drawing processes are insufficient to produce a substantially endless wire form product of said predetermined diameter, said process further comprises subjecting the drawn wire form product of J to at least one repetition of G and H prior to K.

15. The improved process as claimed in claim 1 wherein said sintering sleeve composition comprises metallic silver.

16. The improved process as claimed in claim 1 wherein all of the superconductive ceramic particles that are necessary to produce the entire sintered superconductive core of the wire form product, and all of the metal comprising silver that is necessary to produce the sleeve about the entire sintered superconductive core having said predetermined length and diameter are assembled in said first composite article.

* * * * *